United States Patent
Gopal et al.

(10) Patent No.: US 8,193,010 B2
(45) Date of Patent: Jun. 5, 2012

(54) UNIFORM TRANSFER OF LUMINESCENT QUANTUM DOTS ONTO A SUBSTRATE

(75) Inventors: Ashwini Gopal, Austin, TX (US); Sunmin Kim, Ithaca, NY (US); Xiaojing Zhang, Austin, TX (US); Kazunori Hoshino, Austin, TX (US)

(73) Assignee: Board of Regents, The University of Texas System, Austin, TX (US)

( * ) Notice: Subject to any disclaimer, the term of this patent is extended or adjusted under 35 U.S.C. 154(b) by 117 days.

(21) Appl. No.: 12/824,949

(22) Filed: Jun. 28, 2010

(65) Prior Publication Data

US 2010/0330715 A1  Dec. 30, 2010

Related U.S. Application Data

(60) Provisional application No. 61/221,354, filed on Jun. 29, 2009.

(51) Int. Cl.
*H01L 21/00* (2006.01)
(52) U.S. Cl. .................. 438/21; 438/780; 257/E29.071; 977/887
(58) Field of Classification Search .................... 438/21, 438/780; 257/E29.071; 977/887
See application file for complete search history.

(56) References Cited

U.S. PATENT DOCUMENTS

2006/0269934 A1* 11/2006 Woudenberg et al. ............ 435/6
2008/0230750 A1*  9/2008 Gillies et al. ................... 252/500

OTHER PUBLICATIONS

Anderson et al., "Fabrication of Topologically Complex Three-Dimensional Microfluidic Systems in PDMS by Rapid Prototyping," *Anal. Chem.*, 72:3158-3164 (2000).
Anikeeva et al., "Electroluminescence from a Mixed Red-Green-Blue Colloidal Quantum Dot Monolayer," *Nano Lett.*, 7:2196-2200 (2007).
Caruge et al., "Colloidal quantum-dot light-emitting diodes with metal-oxide charge transport layers," *Nature*, 2:247-250 (2008).
Caruge et al., "NiO as an Inorganic Hole-Transporting Layer in Quantum-Dot Light-Emitting Devices," *Nano Lett.*, 6(12):2991-2994 (2006).
Chen et al., "Voltage Tunable Electroluminescence of CdTe Nanoparticle Light-Emitting Diodes," *J. Nanosci. Nanotechnol.*, 2:47-53 (2002).
Coe-Sullivan et al., "Tuning the performance of hybrid organic/inorganic quantum dot light-emitting devices," *Org. Electron.*, 4:123-130 (2003).
Colvin et al., "Light-emitting diodes made from cadmium selenide nanocrystals and a semiconducting polymer" *Nature*, 370:354-357 (1994).

(Continued)

*Primary Examiner* — Thanh V Pham
(74) *Attorney, Agent, or Firm* — McKeon, Meunier, Carlin & Curfman, LLC

(57) ABSTRACT

A method of uniformly transferring luminescent quantum dots onto a substrate, comprising: a) preparing a colloidal suspension of luminescent quantum dots in a hydrophobic solvent, wherein the density of the hydrophobic solvent is from 0.67 g/cm$^3$ to 0.96 g/cm$^3$; b) dispensing the suspension onto a convex aqueous surface; c) allowing the hydrophobic solvent to evaporate; d) contacting the film of luminescent quantum dots with a hydrophobic stamp; and e) depositing the film of luminescent quantum dots onto a substrate with the hydrophobic stamp is described herein. Further described is a method of preparing quantum dot based light emitting diodes.

17 Claims, 12 Drawing Sheets

OTHER PUBLICATIONS

Cui et al., "Nanowire Nanosensors for Highly Sensitive and Selective Detection of Biological and Chemical Species," *Science*, 293:1289-1292 (2001).

Dabbousi et al., "Electroluminescence from CdSe quantum-dot/polymer composites," *Appl. Phys. Lett.*, 66(11):1316-1318 (1995).

Dabbousi et al., "Langmuir-Blodgett Manipulation of Size-Selected CdSe Nanocrystallites," *Chem. Mater.*, 6: 216-219 (1994).

Dekorsy et al., "Light-emitting silicon pn diodes," *Appl. Phys. A*, 78:471-475 (2004).

Fenter et al., "Thermally induced failure mechanisms of organic light emitting device structures probed by X-ray specular reflectivity," *Chem. Phys. Lett.*, 277:521 (1997).

Frey et al., "Novel Electrodes from Solution-Processed Layer-Structure Materials," *Adv. Mater.*, 14(4):265-268 (2002).

Fujita et al., "Surface Treatment of Indium-Tin-Oxide Substrates and its Effects on Initial Nucleation Processes of Diamine Films," *Japan. J. Appl. Phys.*, 36:350-353 (1997).

Grant No. NSF-NNIN-0335765.

Grant No. ECS-26112892.

Grant No. DMR-0817541.

Grant No. CMMI-0826366.

Hafeman et al., "Light-Addressable Potentiometric Sensor for Biochemical Systems," *Science*, 240:1182-1185 (1988).

Haque et al., "A Multilayered Polymer Light-Emitting Diode Using a Nanocrystalline Metal-Oxide Film as a Charge-Injection Electrode," *Adv. Mater.*, 19:683-687 (2007).

Hikmet et al., "Study of conduction mechanism and electroluminescence in CdSeÕZnS quantum dot composites," *J. Appl. Phys.*, 93:3509 (2003).

Hirschman et al., "Silicon-based visible light-emitting devices integrated into microelectronic circuits," *Nature*, 384:338-341 (1996).

Hofmann et al., "Towards microalbuminuria determination on a disposable diagnostic microchip with integrated fluorescence detection based on thin-film organic light emitting diodes," *Lab Chip*, 5:863-868 (2005).

Hoshino et al., "Near-field scanning optical microscopy with monolithic silicon light emitting diode on probe tip," *Appl. Phys. Lett.*, 92:131106 (2008).

Hoshino et al., "Direct Fabrication of Nanoscale Light Emitting Diode on Silicon Probe Tip for Scanning Microscopy," *J. Microelectromech. Syst.*, 17:4 (2008).

Hoshino et al., "Single Molecular Stamping of a Sub-10-nm Colloidal Quantum Dot Array," *Langmuir*, 24:13804-13808 (2008).

Huang et al., "Nanowires for Integrated Multicolor Nanophotonics," *Small*, 1(1):142-147 (2005).

Jeong et al., "ZnO-Nanowire-Inserted GaN/ZnO Heterojunction Light-Emitting Diodes," *Small*, 3(4):568-572 (2007).

Kang et al., "Quantum-dot light-emitting diodes utilizing CdSe/ZnS nanocrystals embedded in $TiO_2$ thin film," *Appl. Phys. Lett.*, 93:191116 (2008).

Kim et al., "Silicon Compatible Organic Light Emitting Diode," *J. Lightwave Technol.*, 12(12):2107-2113 (1994).

Kittler et al, "Regular Dislocation Networks in Silicon as a Tool for Nanostructure Devices used in Optics, Biology, and Electronics," *Small*, 3(6):964-973 (2007).

Krames et al., "Status and Future of High-Power Light-Emitting Diodes for Solid-State Lighting," *J. Disp. Technol.*, 3(2):160-175 (2007).

Lalic et al., "Light emitting diode structure based on Si nanocrystals formed by implantation into thermal oxide ," *J. Lumin.*, 80:263-267 (1999).

Larkin et al., "Dipolar emitters at nanoscale proximity of metal surfaces: Giant enhancement of relaxation in microscopic theory," *Phys. Rev. B*, 69:121403(R) (2004).

Li et al., "Effects of aquaregia treatment of indium—tin—oxide substrates on the behavior of double layered organic light-emitting diodes," *Appl. Phys. Lett.*, 70(20):2741-2743 (1997).

Liu et al., "Enhanced brightness and efficiency in organic light-emitting diodes using $SiO_2$ as buffer layer and electron-blocking layer ," *J. Lumin.*, 122(123):656-659 (2007).

Lu et al., "Quantum confinement and light emission in $SiO_2$/Si superlattices," *Nature*, 378:258-260 (1995).

Mattoussi et al., "Electroluminescence from heterostructures of poly(phenylene vinylene and inorganic CdSe nanocrystals," *J. Appl. Phys.*, 83(12):7965-7974 (1998).

MicroChem Corporation, http:www.microchem.com, "Nano™ SU-8—Negative Tone Photoresist Formulations 50-100," (2009).

Parker et al., "Efficient blue electroluminescence from a fluorinated polyquinoline," *Appl. Phys. Lett.*, 65(10):1272-1274 (1994).

Parker, ":Carrier tunneling and device characteristics in polymer light-emitting diodes," *Proc. SPIE*, 2144:51-64 (1994).

Price et al., "Addressable, Large-Area Nanoscale Organic Light-Emitting Diodes," *Small*, 3(3):372-374 (2007).

Ray et al., "Metal-Enhanced Fluorescence from CdTe Nanocrystals: A Single-Molecule Fluorescence Study," *J. Am. Chem. Soc.*, 128:8998-8999 (2006).

Rizzo et al., "White Electroluminescence from a Microcontact-Printing-Deposited CdSe/ZnS Colloidal Quantum-Dot Monolayer," *Small*, 4(12):2143-2147 (2008).

Rong et al., "A continuous-wave Raman silicon laser," *Nature*, 433:725-728 (2005).

Santhanam et al., "Microcontact Printing of Uniform Nanoparticle Arrays," *Nano Lett.*, 4(1):41-44 (2004).

Santhanam et al., "Self-Assembly of Uniform Monolayer Arrays of Nanoparticles," *Langmuir*, 19(19): 7881-7887 (2003).

Sato et al., "Stability of organic electroluminescent diodes," *Mol. Cryst. Liq. Cryst.*, 253:143-150 (1994).

Schlamp et al., "Improved efficiencies in light emitting diodes made with CdSe(CdS) core/shell type nanocrystals and a semiconducting polymer," *J. Appl. Phys.*, 82(11):5837-5842 (1997).

Sun et al., "Bright, multicoloured light-emitting diodes based on quantum dots," *Nat. Photon.*, 1:717-722 (2007).

Xu et al., "Microcavity Light-Emitting Devices Based on Colloidal Semiconductor Nanocrystal Quantum Dots," *EEE Photon. Technol. Lett.*, 17(10):2008-2010 (2005).

Xuan et al., "White electroluminescence from a poly(N-vinylcarbazole) layer doped with CdSe/CdS core-shell quantum dots," *Nanotechnology*, 17:4966-4969 (2006).

Zhao et al., "Electroluminescence from isolated CdSe/ZnS quantum dots in multilayered light-emitting diodes," *J. Appl. Phys.*, 96(6):3206-3210 (2004).

Zhou et al., "Enhanced hole injection in a bilayer vacuum-deposited organic light-emitting device using a p-type doped silicon anode," *Appl. Phys. Lett.*, 74(4):609-611 (1999).

\* cited by examiner

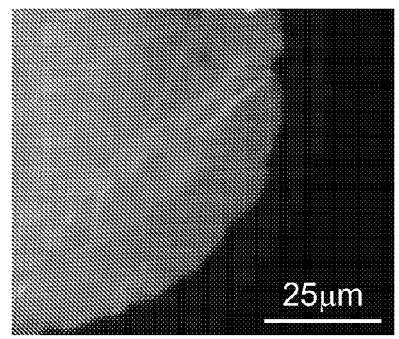
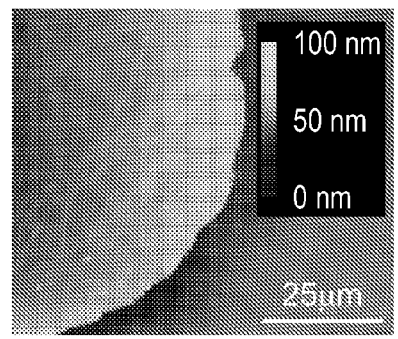
FIG.8A  FIG.8B
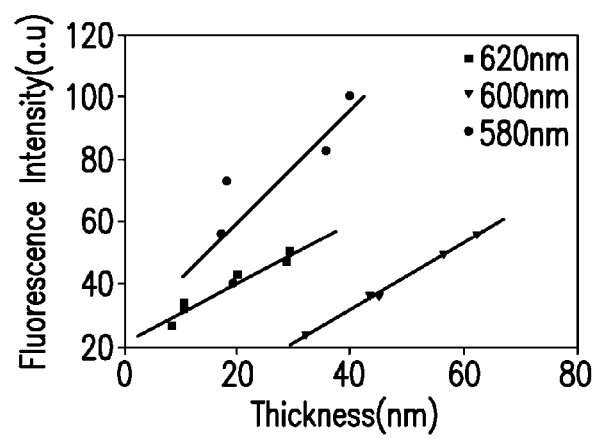
FIG.8C
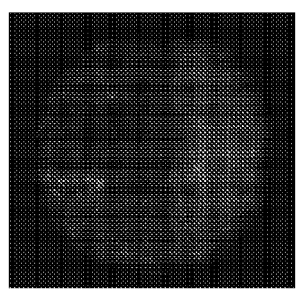
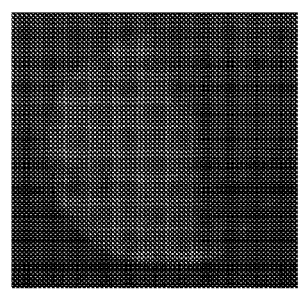
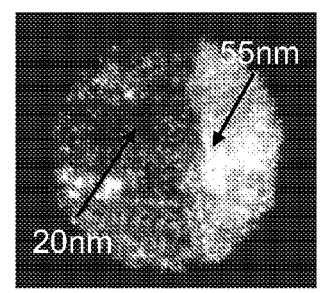
FIG.9A  FIG.9B  FIG.9C

UNIFORM TRANSFER OF LUMINESCENT QUANTUM DOTS ONTO A SUBSTRATE

CROSS REFERENCE TO RELATED APPLICATIONS

This application claims the benefit of priority to U.S. Provisional Application No. 61/221,354, filed on Jun. 29, 2009, which is incorporated by reference herein in its entirety.

ACKNOWLEDGEMENT OF GOVERNMENT SUPPORT

This invention was made with government support from the National Nanofabrication Infrastructure Network supported by National Science Foundation (NSF) Grant number NSF-NNIN-0335765, NSF EPDT Grant number ECS-26112892, NSF IMR Grant number DMR-0817541, and NSF CMMI Grant number CMMI-0826366. The government has certain rights in this invention.

BACKGROUND

Silicon-based light source represents a new path towards integrated, compact and mass manufacturable microsystems for advanced computing, networking, and sensing (Hirschman et al., *Nature* 384:338, 1996; Huang et al., *Small* 1-142, 2005; Rong et al., *Nature* 433:292, 2005). Silicon light emitting diodes (LEDs) have been demonstrated in the visible spectrum, using porous silicon (Hirschman et al., *Nature* 384-338, 1996) and most recently, multi-color emission from silicon nanowire (Huang et al., *Small* 1:142, 2005). It has also been demonstrated that silicon can be used as lasing material for optoelectronic integration with existing complementary metal oxide semiconductor (CMOS) circuitry (Rong et al., *Nature* 433:292, 2005). Integrated optical emitters also play a key role in silicon-based micrototal analysis systems for sensing and imaging (Hofmann et al., *Lab Chip* 5:863, 2005). New frontier of biological applications has also been demonstrated. Dislocation-based silicon light emitters, with emission wavelength 1.5 μm, have been used for manipulation of biomolecules (Kittler et al, *Small* 3:964, 2007). Nanoelectronic light emitting devices (Cui et al., *Science* 293:1289, 2001; Hafeman et al., *Science* 240:1182, 1988) incorporating silicon nanowires are emerging as highly sensitive, and real-time detectors of genes, mRNAs, and proteins. It was demonstrated a nano-scale light emitting diode (LED) created at the silicon probe tip (Hoshino et al., *Appl. Phys. Lett.* 92:131106, 2008; Hoshino et al., *J. Microelectromech. Syst.* 17:4, 2008), with the potential of near-field scanning optical imaging of nanodrug carrier distributions in biomaterials.

Several techniques have been proposed for silicon based LEDs. Some have been developed on bulk substrate using ion implantation at high doses typically followed by high-temperature annealing (Dekorsy et al., *Appl. Phys. A* 78:471, 2004). Others have been demonstrated, using porous silicon (Hirschman et al., *Nature* 384-338, 1996), silicon/silicon dioxide superlattice (Lu et al., *Nature* 378:258, 1995) and embedding silicon nanoparticles in silicon dioxide (Lalic and Linnros, *J. Lumin.* 80:263, 1998). However, silicon, being an indirect band gap material, is fundamentally a poor light emitter (Krames et al., *J. Disp. Technol.* 3:160, 2007).

Colloidal quantum dots, due to their unique tunable luminescence properties, have recently been studied as lumophores in light emitting devices on indium tin oxide (ITO) substrates (Anikeeva et al., *Niano Lett.* 7:2196, 2007; Colvin et al., *Nature* 370:354, 1994; Ray et al., *J. Am. Chem. Soc.* 128:8998, 1006). Nanoparticle based light emitting structures with integrated organic layers have shown improved external quantum efficiencies (Coe-Sullivan et al., *Org. Electron.* 4:123, 2003). Despite their high quantum efficiencies, these organic structures are susceptible to atmospheric conditions, moisture, thermal and electrochemical degradation Fenter et al., *Chem. Phys. Lett.* 277:521, 1997; Sato and Kanai, *Mol. Cryst. Liq. Cryst.* 253:143, 1994; Price et al., *Small* 3:372, 2007). It is hence desirable to have inorganic transport layers for robust LED structures compatible with existing electronics and sensors. Early work on inorganic LEDs had quantum dots sandwiched between either silver and ITO (Hikmet et al., *J. Appl. Phys.* 93:3509, 2003) or NiO and $ZnO:SnO_2$ (Caruge et al., *Nature* 4:4.6, 2008). These LEDs have been developed on ITO substrates, which are not efficient in injecting holes to polymer layers, and an additional hole transporting layers is typically required. Described herein is a method for patterning QD-based light emitting devices (QD-LEDs) and the devices made by such techniques.

SUMMARY

In accordance with the purposes of the described materials, compounds, compositions, articles, and methods, as embodied and broadly described herein, the subject matter described herein, in one aspect, relates to compositions and methods for preparing and using such compositions. In a further aspect, the described subject matter relates to a method of uniformly transferring quantum dots onto a substrate. Still further, described herein is a method of uniformly transferring luminescent quantum dots onto a substrate, comprising: a) preparing a colloidal suspension of luminescent quantum dots in a hydrophobic solvent, wherein the density of the hydrophobic solvent is from 0.67 $g/cm^3$ to 0.96 $g/cm^3$; b) dispensing the suspension onto a convex aqueous surface; c) allowing the hydrophobic solvent to evaporate, thereby forming a film of luminescent quantum dots; d) contacting the film of luminescent quantum dots with a hydrophobic stamp; and e) depositing the film of luminescent quantum dots onto a substrate with the hydrophobic stamp. The method can further include the step of precipitating and re-suspending the luminescent quantum dots in a non-polar solvent (e.g., hexane) prior to the step of preparing the suspension.

Also described herein is a method of preparing quantum dot based light emitting diodes, comprising: a) preparing a colloidal suspension of luminescent quantum dots in a hydrophobic solvent, wherein the density of the hydrophobic solvent is from 0.67 $g/cm^3$ to 0.96 $g/cm^3$; b) dispensing the suspension onto a convex aqueous surface; c) allowing the hydrophobic solvent to evaporate, thereby forming a film of luminescent quantum dots; d) contacting the film of luminescent quantum dots with a hydrophobic polydimethylsiloxane stamp; and e) depositing one or more layers of the film of luminescent quantum dots onto a silicon substrate. The method can further include depositing a plurality of layers of the film of luminescent quantum dots onto the silicon substrate.

Additional advantages will be set forth in part in the description that follows, and in part will be obvious from the description, or may be learned by practice of the aspects described below. The advantages described below will be realized and attained by means of the elements and combinations particularly pointed out in the appended claims. It is to be understood that both the foregoing general description and the following detailed description are exemplary and explanatory only and are not restrictive.

DESCRIPTION OF FIGURES

The accompanying figures, which are incorporated in and constitute a part of this specification, illustrate several aspects described below.

FIG. 8 shows the patterned particles with 576 nm emission wavelength. Panel (a) is a fluorescence image. Panel (b) is an AFM image. Panel (c) is a graph plotting the thickness of the film versus the fluorescence intensity values.

FIG. 9 shows photo/electroluminescence from an identical circular pattern. Panel (a) is the photoluminescence image. Panel (b) is the electroluminescence image. Panel (c) is an intensity plot of photoluminescence.

DETAILED DESCRIPTION

Figure 1A:
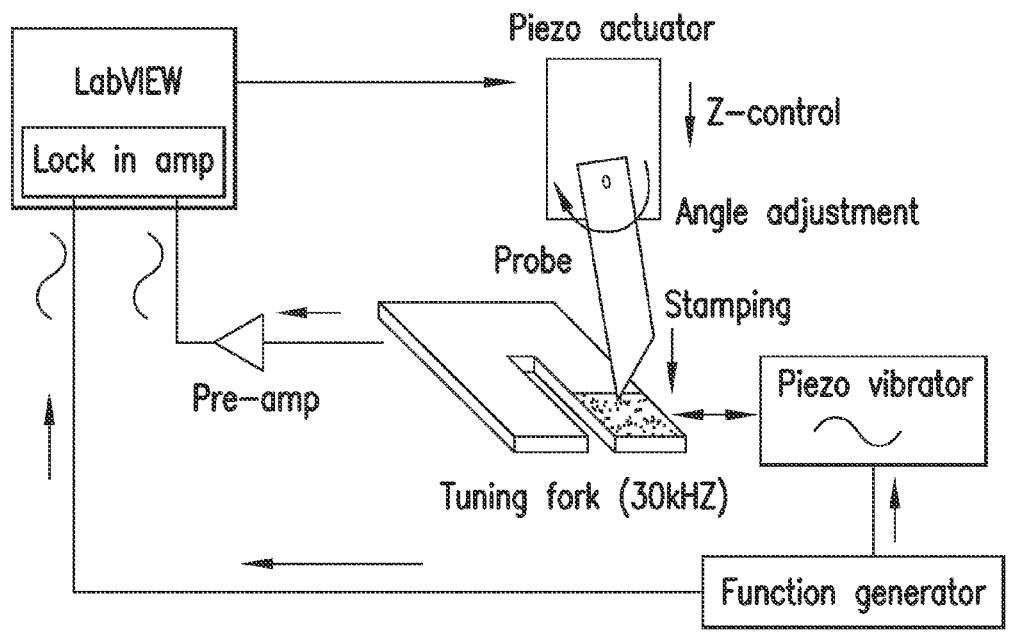
FIG. 1 is a drawing representing the schematics of the hydrophobic stamp. Panel (a) displays the experimental setup. Panel (b) shows the control parameters used.

The materials, compounds, compositions, and methods described herein may be understood more readily by reference to the following detailed description of specific aspects of the disclosed subject matter and the Examples included therein and to the Figures.

Before the present materials, compounds, compositions, and methods are disclosed and described, it is to be understood that the aspects described below are not limited to specific synthetic methods or specific reagents, as such may, of course, vary. It is also to be understood that the terminology used herein is for the purpose of describing particular aspects only and is not intended to be limiting.

Also, throughout this specification, various publications are referenced. The disclosures of these publications in their entireties are hereby incorporated by reference into this application in order to more fully describe the state of the art to which the disclosed matter pertains. The references disclosed are also individually and specifically incorporated by reference herein for the material contained in them that is discussed in the sentence in which the reference is relied upon.

In this specification and in the claims that follow, reference will be made to a number of terms, which shall be defined to have the following meanings:

Throughout the specification and claims the word "comprise" and other forms of the word, such as "comprising" and "comprises," means including but not limited to, and is not intended to exclude, for example, other additives, components, integers, or steps.

As used in the description and the appended claims, the singular forms "a," "an," and "the" include plural referents unless the context clearly dictates otherwise. Thus, for example, reference to "a substrate" includes mixtures of two or more such substrates, and the like.

Reference will now be made in detail to specific aspects of the disclosed materials, compounds, compositions, articles, and methods, examples of which are illustrated in the accompanying Examples and Figures.

Described herein is a technique for patterning inorganic QD-based light emitting devices (QD-LEDs), through microcontact printing (Santhanam and Andres, *Nano Lett.* 4:41, 2004; Santhanam et al., *Langmuir* 19:7881, 2003; Rizzo et al., *Small* 4:2143, 2008) of quantum dots on p-type silicon substrates under room temperature. P-type silicon in the QD-LED structure acts as the hole transport layer, since a p-type silicon anode with a thin layer of silicon dioxide energy barrier can enhance hole injection when compared to ITO as an anode in organic light emitting diodes (Zhou et al., *Appl. Phys. Lett.* 74:609, 1999). The compatibility of microcontact printing with most of the existing silicon microfabrication techniques ensures the future opportunities of the QD-LED on silicon. In addition, microcontact printing is potentially capable of patterning a few number of colloidal QDs with well-defined geometry. The controlled deposition of single molecular order of colloidal QDs has been recently demonstrated (Hoshino et al., *Langmuir* 24:13804, 2008). Stamping-based microfabrication of a stable light emitting device will have a wide range of applications ranging from integrated circuits (ICs) compatible nanophotonics, microelectromechanical systems (MEMS), to micrototal analysis systems for biomedical research, and to future molecular electronics.

A method of depositing uniform films of luminescent quantum dots onto a substrate using self-assembly and microcontact printing techniques is provided herein. The film of luminescent quantum dots is self-assembled on an aqueous surface by dispensing a colloidal suspension of luminescent quantum dots in a hydrophobic solvent. The film of luminescent quantum dots can then be transferred onto a substrate by using a hydrophobic stamp as described herein. The hydrophobic stamp (e.g., a polydimethylsiloxane stamp) can include micro-scale features that allow an array of patterns of the quantum dots to be deposited onto substrates. The method can be conducted at room temperature.

The method of uniformly transferring luminescent quantum dots onto a substrate includes: a) preparing a colloidal suspension of luminescent quantum dots in a hydrophobic solvent, wherein the density of the hydrophobic solvent is from 0.67 g/cm$^3$ to 0.96 g/cm$^3$; b) dispensing the suspension onto a convex aqueous surface; c) allowing the hydrophobic solvent to evaporate, thereby forming a film of luminescent quantum dots; d) contacting the film of luminescent quantum dots with a hydrophobic stamp; and e) depositing the film of luminescent quantum dots onto a substrate with the hydrophobic stamp. The method can further include the step of precipitating and re-suspending the luminescent quantum dots in a non-polar solvent (e.g., hexane) prior to the step of preparing the suspension. The step of allowing the hydrophobic solvent to evaporate can be passive or active (e.g., by applying heat and/or vacuum to facilitate the evaporation of the solvent).

The colloidal suspension of luminescent quantum dots can be prepared in a mixture of two hydrophobic solvents. For example, the mixture of two hydrophobic solvents can be a mixture of hexane and 1,2-dichloroethane. The mixture of two hydrophobic solvents can be in any ratio, including a 1:1 mixture, a 1:2 mixture, and a 1:3 mixture, and the like. The density of the hydrophobic solvent or mixture of hydrophobic solvents can be, for example, about 0.67 g/cm$^3$, 0.68 g/cm$^3$, 0.69 g/cm$^3$, 0.70 g/cm$^3$, 0.71 g/cm$^3$, 0.72 g/cm$^3$, 0.73 g/cm$^3$, 0.74 g/cm$^3$, 0.75 g/cm$^3$, 0.76 g/cm$^3$, 0.77 g/cm$^3$, 0.78 g/cm$^3$, 0.79 g/cm$^3$, 0.80 g/cm$^3$, 0.81 g/cm$^3$, 0.82 g/cm$^3$, 0.83 g/cm$^3$, 0.84 g/cm$^3$, 0.85 g/cm$^3$, 0.86 g/cm$^3$, 0.87 g/cm$^3$, 0.88 g/cm$^3$, 0.89 g/cm$^3$, 0.90 g/cm$^3$, 0.91 g/cm$^3$, 0.92 g/cm$^3$, 0.93 g/cm$^3$, 0.94 g/cm$^3$, 0.95 g/cm$^3$, and 0.96 g/cm$^3$, where any of the stated values can form an upper or lower endpoint of a range.

The hydrophobic stamp used to contact and deposit the film of luminescent quantum dots onto a substrate can be formed from polydimethylsiloxane (other useful hydrophobic materials will be apparent to those of skill in the art). In some examples, the substrate with the film of luminescent quantum dots is used in a light emitting diode. In some examples, the substrate on which the film of luminescent quantum dots is deposited is a hole transport layer (HTL) material for use in a LED. An example of a HTL is a silicon based substrate. The thickness of the film deposited onto the substrate can be from 25 nm to 55 nm. For example, the thickness of the film can be from 30 nm to 50 nm, or 35 nm and 45 nm. The luminescent quantum dots can be composed of an inner core and an outer shell. The inner core can be, for example, CdSe. The outer core can be, for example, ZnS. In some examples, the luminescent quantum dots can be formed of CdSe:ZnS (core:shell).

Also described herein is a method of preparing quantum dot based light emitting diodes, comprising: a) preparing a colloidal suspension of luminescent quantum dots in a hydrophobic solvent, wherein the density of the hydrophobic solvent is from 0.67 g/cm$^3$ to 0.96 g/cm$^3$; b) dispensing the suspension onto a convex aqueous surface; c) allowing the hydrophobic solvent to evaporate, thereby forming a film of luminescent quantum dots; d) contacting the film of luminescent quantum dots with a hydrophobic polydimethylsiloxane stamp; and e) depositing one or more layers of the film of luminescent quantum dots onto a HTL such as a silicon substrate. Additional layers used to form a LED can then be added to create a LED. For example, an electron transport layer, e.g., ZnO:SnO$_2$, on the quantum dot layer (which can be on a silicon substrate), and a cathode layer, e.g., Au/Ag or Al. Additional substrate, electron transport, hole transport, and cathode layers useful with LEDs will be apparent to those of skill in the art. The method can further include depositing a plurality of layers of the film of luminescent quantum dots onto the silicon substrate. In this method, the luminescent quantum dots can be formed of, for example, CdSe:ZnS.

The examples below are intended to further illustrate certain aspects of the methods, compounds, and compositions described herein, and are not intended to limit the scope of the claims.

EXAMPLES

The following examples are set forth below to illustrate the methods and results according to the disclosed subject matter. These examples are not intended to be inclusive of all aspects of the subject matter disclosed herein, but rather to illustrate representative methods and results. These examples are not intended to exclude equivalents and variations of the present invention which are apparent to one skilled in the art.

Efforts have been made to ensure accuracy with respect to numbers (e.g., amounts, temperature, pH, etc.) but some errors and deviations should be accounted for. Unless indicated otherwise, parts are parts by weight, temperature is in ° C. or is at ambient temperature, and pressure is at or near atmospheric. There are numerous variations and combinations of conditions, e.g., component concentrations, temperatures, pressures, and other reaction ranges and conditions that can be used to optimize the described process. Only reasonable and routine experimentation will be required to optimize such process conditions.

Example 1

Experimental Setup for Nanoscale Stamping

Figure 1B:
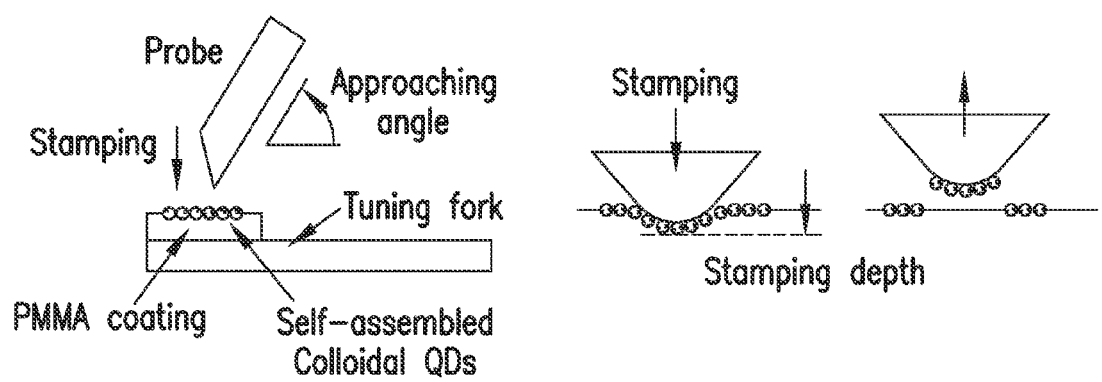

FIG. 1 shows the experimental setup of the nanoscale stamping transfer. In the nanoscale stamp, the force sensing capability is integrated on the source side, rather than on the target. This significantly reduces requirements on modifying the scanning probe's physical characteristics, such as size, shape, stiffness, and resonant frequency. In addition, high-throughput stamping experiments can be carried out without the need to install the probe onto an already complicated scanning microscopy setup.

Figure 2A:
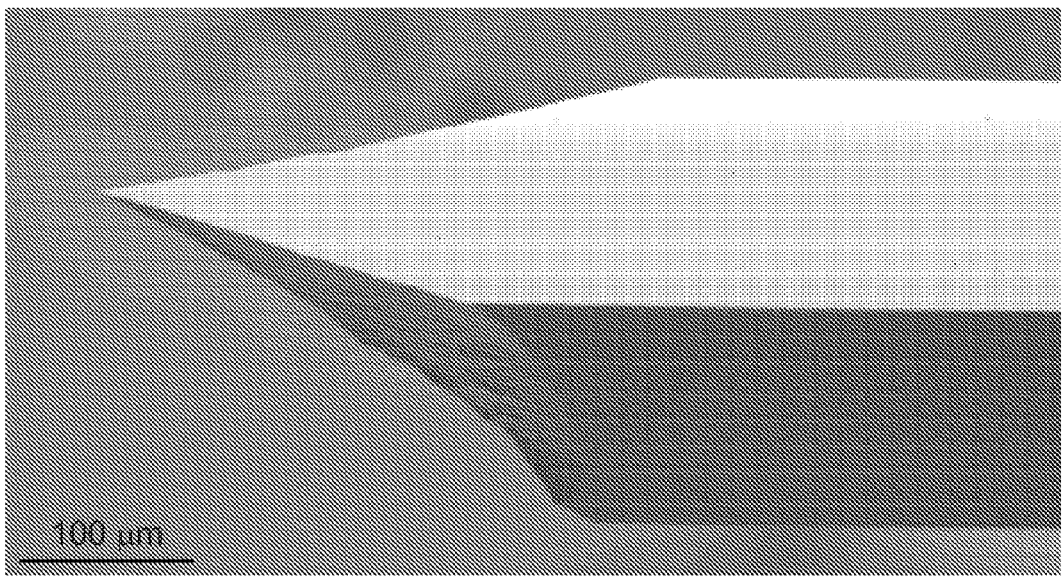
FIG. 2 shows SEM photographs of the silicon probe. Panel (a) is the oblique-view. Panel (b) is the side-view.
Figure 2B:
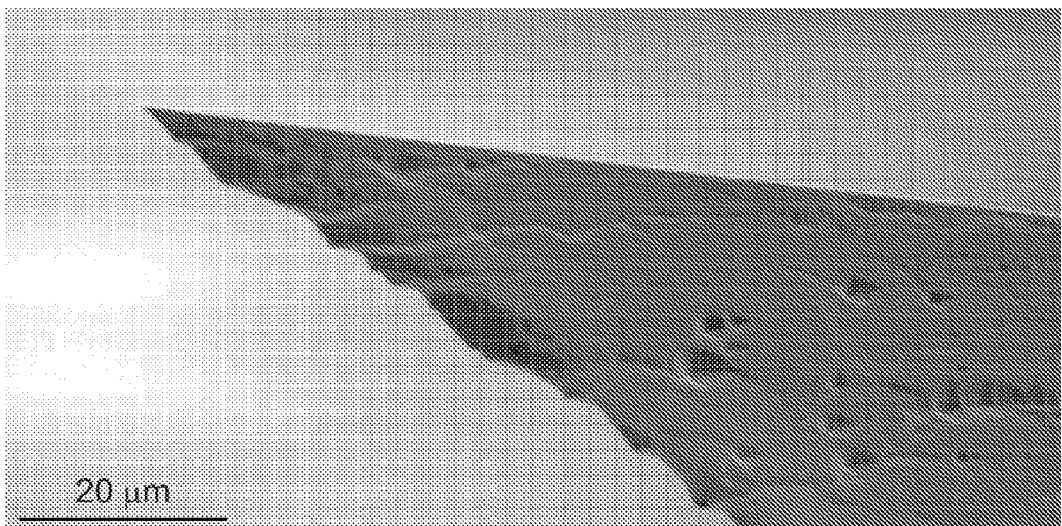

A quartz tuning fork, oscillated at its resonant frequency, serves as the force sensor. An external piezo vibrator is used to induce the oscillation amplitude roughly estimated to be 1 nm. The typical resonant frequency and the Q factor are 32.6 kHz and 3000, respectively. The oscillation dampening, through the impression of the approaching probe tip on the QD layers, is monitored with a lock-in amplifier built in a LabVIEW virtual instrument (National Instruments; Austin, Tex.), which enables the position control of the probe tip with a resolution greater than 0.5 nm. Silicon probe tips were prepared by standard wet etching of a single crystal silicon wafer. Scanning electron microscopy (SEM) photographs of the tip are shown in FIG. 2. The probe retains a flat top surface, which is used as the destination surface for the transfer. A piezo stage precisely displaces the probe tip to impress the surface of a tuning fork prepared with self-assembled QDs, which results in highly localized transfer of QDs at the probe tip. Unlike the conventional noncontact feedback control introduced for scanning probe microscopy, the piezo stage allows the tip to penetrate the QD layer until the depth reaches the preset value. The PMMA coating, whose Young's modulus (typically 2-3 GPa) is smaller than that of silicon (130-190 GPa) by approximately 2 orders of magnitude, serves as a "stamp pad" which reduces the likelihood of damage to the probe tip while stamping.

Example 2

QD Film Preparation

Figure 3:
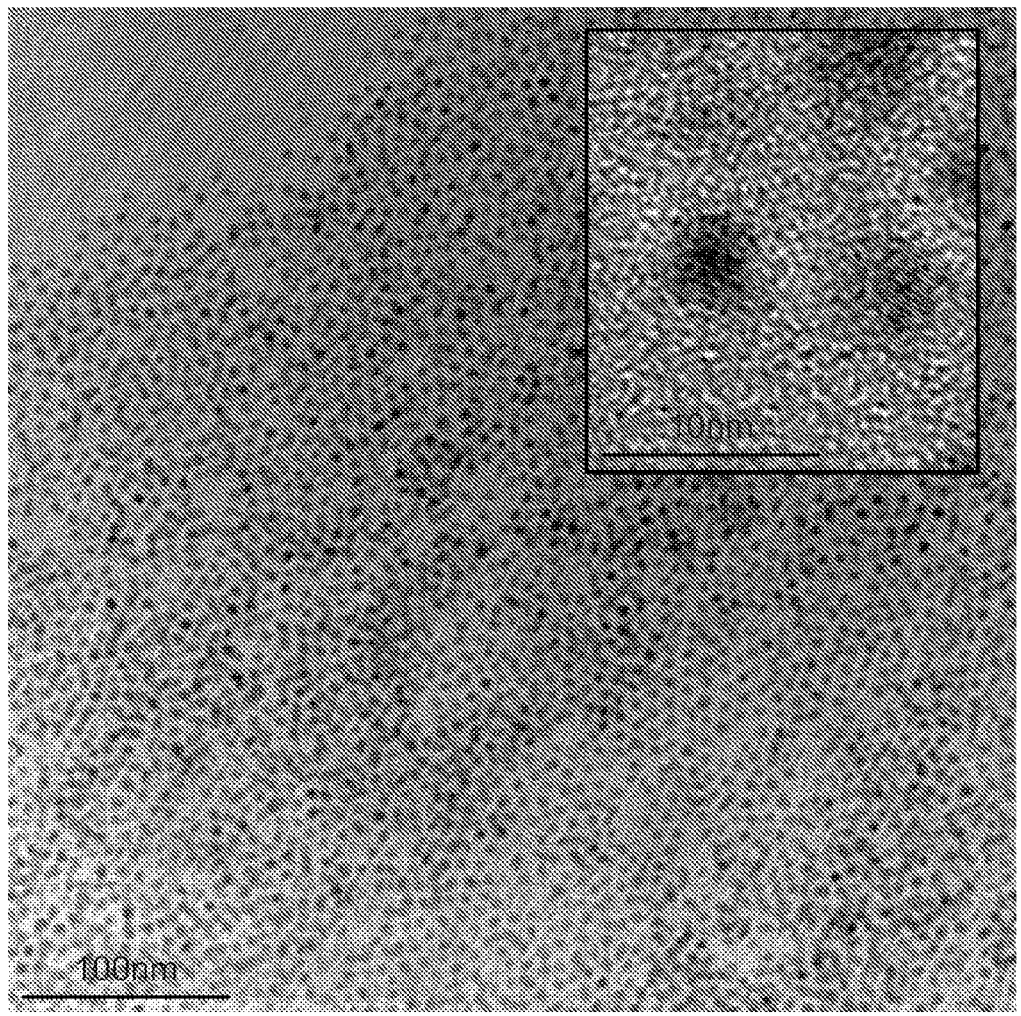
FIG. 3 shows a TEM micrograph of self-assembled quantum dots.

CdSe:ZnS core-shell particles acquired from Evident Technologies (Troy, N.Y.) were used. QDs with different average diameters, namely, 9.8, 9.0, 8.0, 7.8, and 7.4 nm (emission wavelength peaks 620, 600, 580, 560, and 540 nm, respectively), were tested and successfully stamped using the same stamping procedures. The smaller band gap of the larger QDs allows easier excitation. Here, QDs with an average diameter of 9.8 nm are used for further measurement and evaluation as a near-field light emitting source. Close-packed colloidal QDs were prepared on a PMMA precoated tuning fork. First, the QDs were precipitated and resuspended in hexane to remove excess ligands. Then 0.032 nmol of the quantum dots were mixed into 400 μL of a 50:50 (v/v) solvent of hexane and 1,2-dichloroethane. This hydrophobic colloidal suspension was dispensed onto a 2 cm diameter convex water surface, pinned at the edge by a Teflon disk. As the solvent evaporated, the QDs formed a uniform array due to capillary immersion and convective forces. This floating film was then gently touched and picked up with the PMMA precoated tuning fork. FIG. 3 shows a transmission electron microscopy (TEM) image of QDs on a carbon film coated TEM grid prepared by the technique described above. TEM and AFM measurements show the thickness of the prepared film to be 1-4 monolayers. The particles on the tuning fork can be transferred to destination surfaces within a few hours after sample preparation. Here, all the stampings were conducted within 30-60 min to maintain temporal consistency for performance comparison. These methods are described in Hoshino et al., *Langmuir*(2008) 24, 13804-13808, which is hereby incorporated by reference.

Example 3

Preparation of Quantum Dot Based Light Emitting Diodes

A colloidal quantum dot based light emitting diode (QD-LED) is described which utilizes the p-type silicon substrate as the hole transporting layer. A microcontact printing technique was introduced to pattern self-assembled CdSe:ZnS QD films, which allowed creation of an LED with well-defined geometry suitable for monolithic integration on silicon substrates. The QD-LED comprises multi-layers of inorganic materials: a combination of Au (thickness: 5 nm) and Ag (12 nm) as the cathode, a $ZnO:SnO_2$ mixture (ratio 3:1, 40 nm) as the electron transporting layer, CdSe:ZnS QDs as the light emission layer, 1 nm $SiO_2$ as an energy barrier layer, and p-type silicon as the hole transporting layer. These printed QD-LEDs are capable of multi-color emission peaked at wavelengths of 576 nm, 598 nm, and 622 nm, corresponding to sizes of the embedded QDs with the diameters of 8.4 nm, 9.0 nm, and 9.8 nm respectively. The thickness of the quantum dot layers that can result in light emission is characterized using atomic force microscopy: for 8.4 nm QDs, the value is 33 nm (±5 nm) or about 4 ML (monolayers). Larger turn-on voltages were measured (2, 4 and 5 V) for the smaller average particle diameters (9.8 nm, 9.0 nm and 8.4 nm, respectively). The mixture ratio of Zn and Sn was optimized (40% Zn and 25% Sn) to maintain proper hole-electron recombination at the QD layer and avoid the yellowish-white emission from $ZnO/SnO_2$.

Structure Design and Energy Band Diagram

Figure 4A:
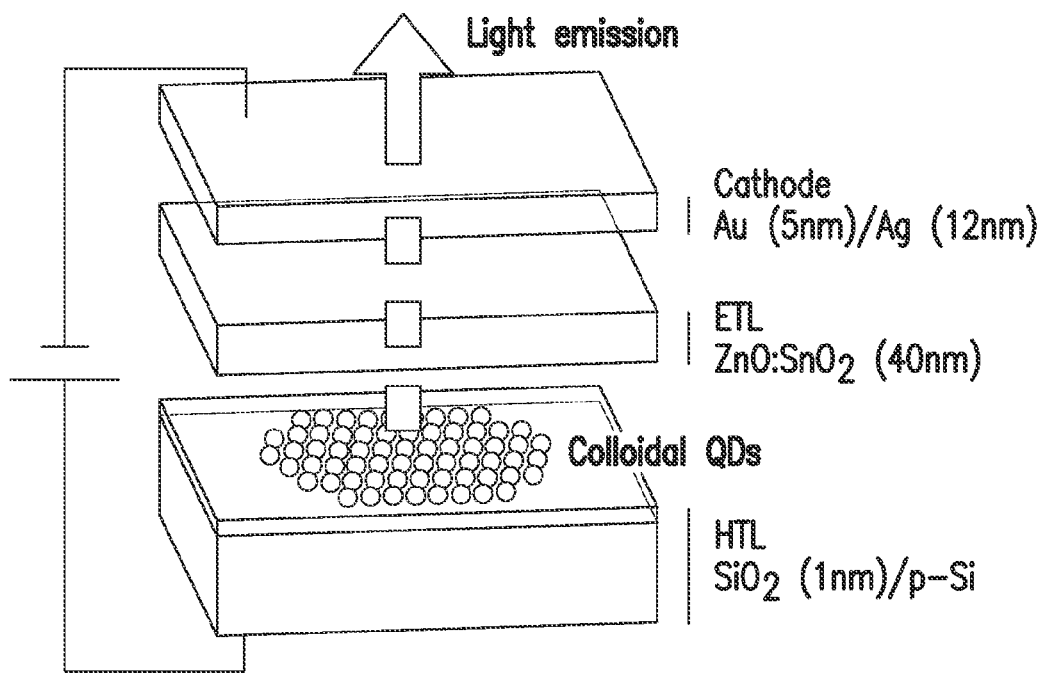
FIG. 4 shows the design of the silicon-based quantum dot LED. Panel (a) shows the schematics of the QD-LED structure. Panel (b) shows the energy levels of quantum dots on silicon substrates.
Figure 4B:
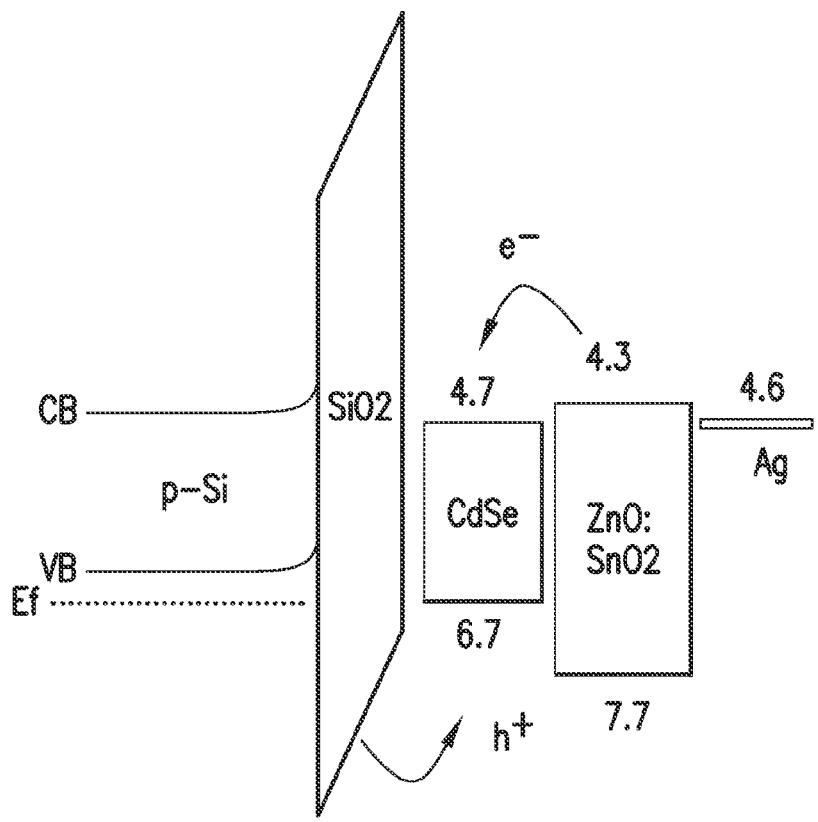
Figure 5A:
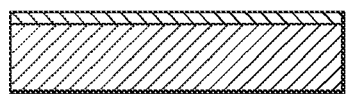
FIG. 5 shows the fabrication process for quantum dot light emitting diodes. Panels (a)-(e) represent the steps of the process.
Figure 5B:
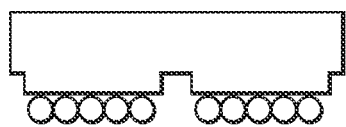
Figure 5C:
Figure 5D:
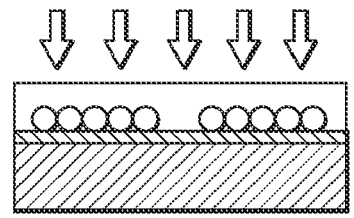
Figure 5E:
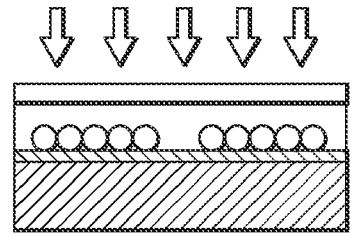

The structure of QD-based LEDs comprises multi-layers of inorganic materials: the combination of Au (thickness: 5 nm) and Ag (12 nm) as the cathode, $ZnO: SnO_2$ (ratio 3:1, 40 nm) as the electron transporting layer, CdSe:ZnS particles as the light emission layer, 1 nm silicon dioxide and p-type silicon as the bottom electrode. Resistivity of p-type silicon is 10-100 Ωcm. The emission is observed through the top metal cathode, similar to a top emitting organic light emitting diode (TEOLED). FIG. 4 gives the structure and the energy band diagram of the inorganic light emitting diode, where the holes are injected from the p-type silicon via silicon dioxide, and transported to the QDs. Similarly the electrons are injected from the Ag/Au negative electrode into $ZnO/SnO_2$ and transported to the QDs. The electron affinity and ionization energy for CdSe QDs are taken from previous experimental data (Schlamp et al., *J. Appl. Phys.* 82:5837, 1997; Dabbousi et al., *Appl. Phys. Lett.* 66:1316, 1995). There are a number of advantages using p-type silicon as a hole injection layer, as compared to ITO (Zhou et al., *Appl. Phys. Lett.* 74:609, 1999). ITO is inefficient in injecting holes to polymer layers whereby an additional hole transporting layers is required before an emitting layer in the system (Parker *Proc. SPIE* 2144:51, 1994; Fujita et al., *Japan. J. Appl. Phys.* 36:350, 1997; Li et al., *Appl. Phys. Lett.* 70:2741, 1997). Carrier injection from silicon electrode is improved because most of the electric field drop occurs across the highly resistive layer of thin $SiO_2$. The $SiO_2$ on silicon acts as a buffer layer for the system. The buffer layer will restrain the injected hole current and then improve the balance between hole and electron injection. Resulting high probability of radiative recombination consequently promote luminance and electroluminescence (EL) efficiency (Liu et al., *J. Lumin.* 122:656, 2007). The Fermi level of the silicon is aligned to that of the electroluminescent material (Kim et al., *Lightwave Technol.* 12:2107, 1994). The excitons produced at QD layers can be easily quenched in close proximity to a metal electrode (Larkin et al., *Phys. Rev. B* 69:121403, 2004). The $ZnO:SnO_2$ layer hence separates the electroluminescent QD layer from the metal layer where by increasing the radiative recombination. $ZnO:SnO_2$ layer improves the electron injection into the system and simultaneously acts as a hole blocking layer. Band diagram of this device reveals that the barrier injection from ZnO layer into the emitting quantum dots is small. A strong hole injection is offered by the thin $SiO_2$ layer on p-type silicon anode.

Fabrication

FIG. 5 shows the fabrication process. Patterned polydimethylsiloxane (PDMS) stamps were used to stamp CdSe:ZnS QDs onto bare 100 p-type silicon with 1 nm thick oxide. QDs for the stamping process were prepared as follows (Santhanam and Andres, *Nano Lett.* 4:41, 2004; Santhanam et al., *Langmuir* 19:7881, 2003): first, CdSe:ZnS QDs were precipitated and re-suspended in hexane to remove excess ligands. A hydrophobic colloidal suspension of 15 μl of CdSe:ZnS core shell particles (Evident Technologies; Troy, N.Y.) in a 50:50 (v/v) solvent of 1,2-dichloroethane (Sigma Aldrich; St. Louis, Mo.) and hexane (Sigma Aldrich; St. Louis, Mo.) making a total of 400 μl solution was prepared. This solution was then pipetted onto a 20 mm diameter convex water surface pinned at the edge by a teflon disk (20 mm inner diameter, 2 mm thick) on a Petri dish. The solvent present on the surface of water evaporated, forming a uniform array of self-assembled nanoparticles due to capillary immersion and convective forces. The film was then picked up by hydrophobic PDMS stamps with circular patterns (diameter: 100 μm) and deposited onto a substrate. This procedure was repeated with QDs with average diameters ranging from 8.4 nm, 9.0 nm, 9.8 nm, with corresponding photoluminescence peaks from 576 nm, 598 nm, 618 nm. The PDMS stamp was fabricated based on the rapid prototyping technique. SU8 photoresist (Microchem Corp.; Newton, Mass.) was patterned photolithographically on a silicon wafer. Depending on the stamp height specification for the device, SU8-2100 (100 μm thickness) was used. Photolithography process specifications are provided by Microchem Corporation. PDMS (Sylgard 184, Dow Corning Corp.; Midland, Mich.) was then poured over the SU8 master mold, cured at 70° C. for 30 min, and peeled off the mold to form the microstructures (Anderson et al., *Science* 261:895, 1993). The PDMS stamps were treated with buffered oxide etchant (ammonium fluoride solution with HF in a 6:1 ratio) for 1 min to prevent sticking onto the substrate during microcontact printing (Kim et al., *Lightwave Technol.* 12:2107, 1994). After stamping, the substrate was annealed at 140° C. for 15 min to remove excess organic solvents (Mattoussi et al., *J. Appl. Phys.* 83:7965, 1998).

Figure 6:
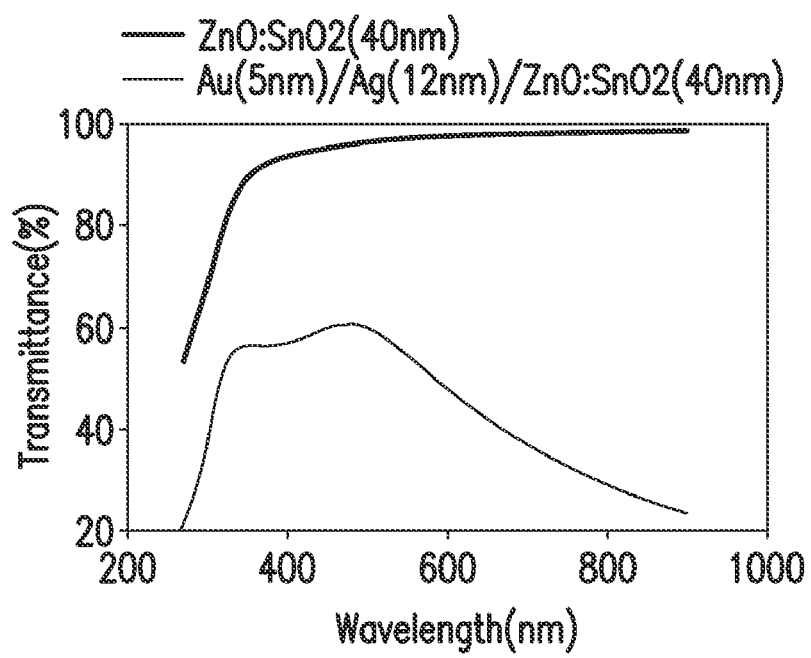
FIG. 6 is an optical transmittance spectrum of top inorganic layers.

Besides organic materials, inorganic materials have been considered as a transport layer in organic or QD-LEDs. Inorganic materials enhance the stability of solution processed LEDs. $MoS_2$ (Frey et al., *Adv. Mater.* 14:265, 2002) and NiO (Caruge et al., *Nano Lett.* 6:2991, 2006) have been used as hole transport layers in OLEDs or QD-LEDs respectively. Some recent publication reports also indicate the use of $TiO_2$ (Hague et al., *Adv. Mater.* 19:683, 2007; Kang et al., *Appl. Phys. Lett.* 93:191116, 2008) and ZnO (Caruge et al., *Nature* 4:4.6, 2008; Jeong et al., *Small* 3:568, 2007) as an electron transport layer in light emitting diodes. Here, a thin film mixture of ZnO: $SnO_2$, of 40 nm thickness, was RF co-sputtered with a low deposition rate of 0.2 Å s$^{-1}$ to avoid damage to the QD layer. Sputtered ZnO:$SnO_2$ without additional oxygen exposure during sputtering acts as an electron transport layer. A transparent top electrode with 120 Å of silver (Ag) and 50 Å of gold (Au) was e-beam evaporated at 0.4 Å s$^{-1}$ and 0.5 Å s$^{-1}$ respectively. Optical transparencies of ZnO:$SnO_2$ films was measured to be 90% (FIG. 6). Depositing a thin transparent metal Au(5 nm)/Ag(12 nm) electrode reduces optical transmission to 60-40% from 500 to 700 nm emission wavelength, compared to using the ZnO:$SnO_2$ electrode.

Nanoparticle Thin Film Characterization

Figure 7:
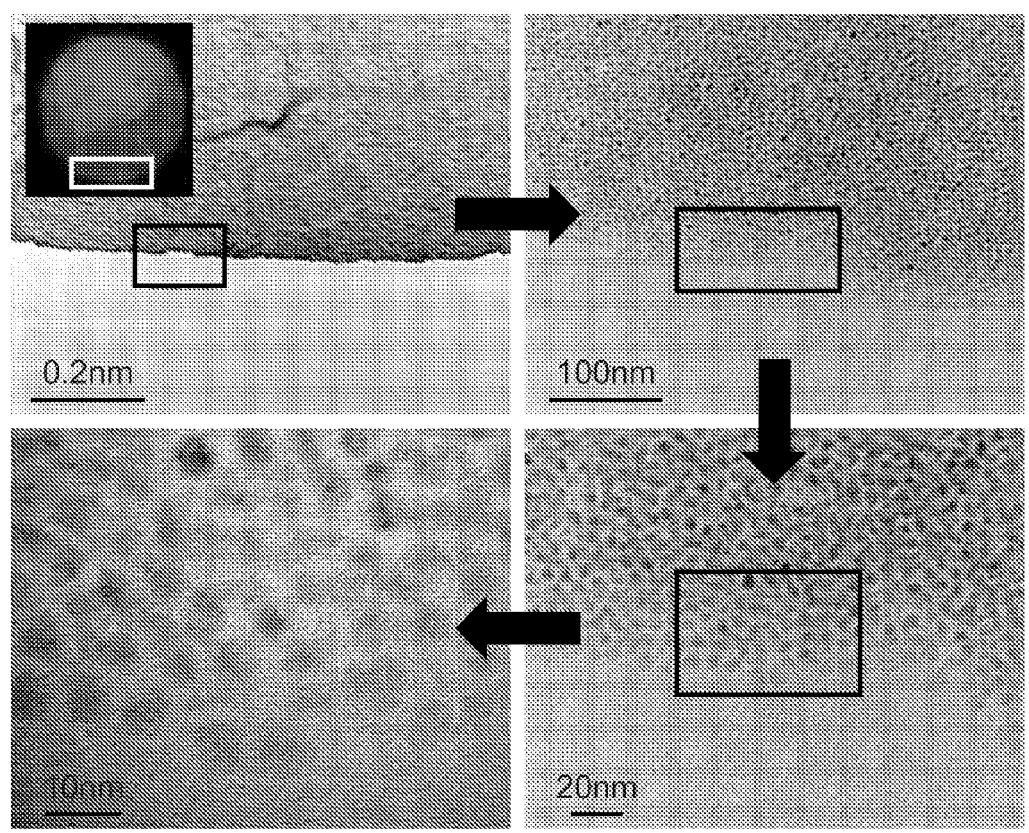
FIG. 7 shows TEM images of stamped particles deposited using the microcontact printing technique.

Patterned CdSe:ZnS QDs were deposited onto transmission electron microscopy (TEM) grids with the above described procedure. FIG. 7 shows the TEM image of the circular patterned (diameter 100 μm) particles with a 9.0 nm average diameter (emission wavelength: 598 nm). Well-defined area of packed QDs was observed, roughly suggesting the layer thickness to be a few monolayers. Similar characteristics were observed for particles with diameter 8.4, 9.0 and 9.8 nm. Thicknesses of deposited particles were further assessed by atomic force microscopy (AFM). An example is shown in FIG. 8. Particles with emission wavelength 576 nm and particle 8.4 nm were deposited onto silicon and AFM measurement was performed. Peak to peak roughness of the stamped film was less than 10 nm indicating controlled deposition of the nanoparticle film. The measured thickness of the film was 33 nm indicating deposition of 4 ML of particles. Thickness measurements using Atomic Force Microscopy (AFM) were correlated with photoluminescence intensity data extracted from the optical micrographs. After measuring the thickness of the film stamped on silicon substrates (100 μm diameter stamps), the same sample was imaged under the fluorescence microscope. Fluorescence optical micrograph was processed via MATLAB (The Math Works; Natick, Mass.), by adding all red green blue (RGB) values per pixel to yield intensity values. Intensity values were obtained at five different points on each same stamped pattern and averaged. This was repeated for patterns with different particle thickness. Stamped films exhibited uniformity and evenness throughout each layer; it was assumed that the edge height measured with the AFM corresponded to the film thickness throughout the layer. As shown in FIG. 8(c), a strong positive, linear correlation between QD film thickness and photoluminescence was observed. As film thickness increases, the fluorescence intensity also increases. Increase in intensity was observed for change in thickness as small as of 10 nm. Deviations from this correlation can be attributed to the differences in the film density. These measurements indicated that the thickness of QDs varied from one monolayer to ten monolayers, depending on the amount of nanoparticles added to the colloidal suspension as well as the size of the particles used. Therefore, thickness distribution of the quantum dot layer can be estimated using the fluorescence images through the calibration curves shown in FIG. 8(c).

Device Optimization: Monolayer Thickness, Materials and Photoluminescence

The quantum dot thickness plays an important role in device functioning. FIG. 9(a) shows the photoluminescence from a circular pattern of 9.8 nm particles deposited with some local thickness variation. Thickness distribution of the quantum dot layer was estimated using the fluorescence image. The RGB image of the photoluminescence was processed using MATLAB™ to yield intensity values in FIG. 9(c). This was correlated to the thickness values shown in FIG. 8. It was observed that left side of the circle was thinner (20 nm) compared to the right half (50 nm). On application of voltage across the system light emission was observed on the left side of the circle (FIG. 9(b)). For FIG. 9(b), driving voltage of 6 V was applied to observe electroluminescence from the left side of the device. Thicker quantum dot layer would result in an increase in operating voltage and decrease of carrier injection (Schlamp et al., *J. Appl. Phys.* 82:5837, 1997; Sun et al., *Nat. Photon.* 1:717, 2007; Xuan et al., *Nanotechnology* 17:4966, 2006; Xu et al., *IEEE Photon. Technol. Lett.* 17:2008, 2005). The presented technique allows the creation of CdSe:ZnS quantum dot thin film based LED with well-defined geometry and multi-color emission. The relative small non-uniformity of particle distribution is mainly attributed to two factors: (1) CdSe:ZnS nanoparticles are not perfectly spherical in shape, as shown in FIG. 7 TEMs. Therefore, they tend to cause a minor variation or cracks in the resulting thin film, which causes a non-uniformity in the transfer of particles to the stamp. (2) During the manual operation of the stamps in picking up the film, PDMS stamps may attract small water droplets, which can cause variations in particle density. Due to the surface tension, water droplets tend to distribute quantum dots around its spherical surface. During the evaporation, the particles attached to the spherical surfaces interact and form multi-layers. To further improve the homogeneity of the deposited film, highly localized and controlled version of microcontact printing is under development.

For QD-LED with organic transporting layers, a thickness of 2 ML (for particle size 9.8 nm) was reported to be optimal thickness for light emission (Kang et al., *Appl. Phys. Lett.* 93:191116, 2008). Here, it was observed that a thickness of 30±5 nm (about 3 ML), 40±5 nm (about 4 ML), 55±5 nm (about 6 ML) is sufficient for good light emission from particles of size 9.8 nm, 9.0 nm and 8.4 nm respectively. Carrier charge into smaller quantum dots has been shown to exhibit lower efficiency than that of larger quantum dots of the same composition. This is due to the mismatch between the highest occupied molecular orbitals (HOMOs) of the QDs and hole transport layers (HTLs).

The quality of the quantum dots on the PDMS substrate depends on the film that is prepared on the convex surface of the water trough. The convex water level curvature was varied by controlling the volume of water used. After a series of experiments, the optimum water level that was used consistently throughout the experiment was determined. The radius of curvature of the convex water surface was optically determined to be approximately around 40 mm. The film was formed after about 15 min of evaporation. PDMS stamps, with an approximate total area of 25 mm$^2$, were used to deposit film.

Figure 10:
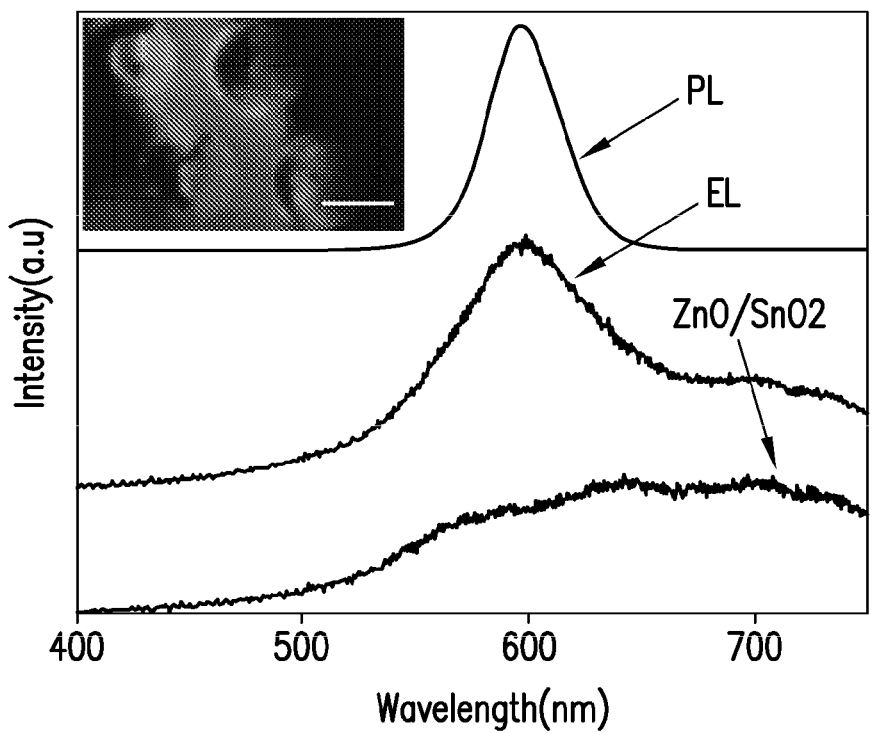
FIG. 10 is a graph showing the simultaneous emission from ZnO and CdSe nanoparticles.
Figure 11:
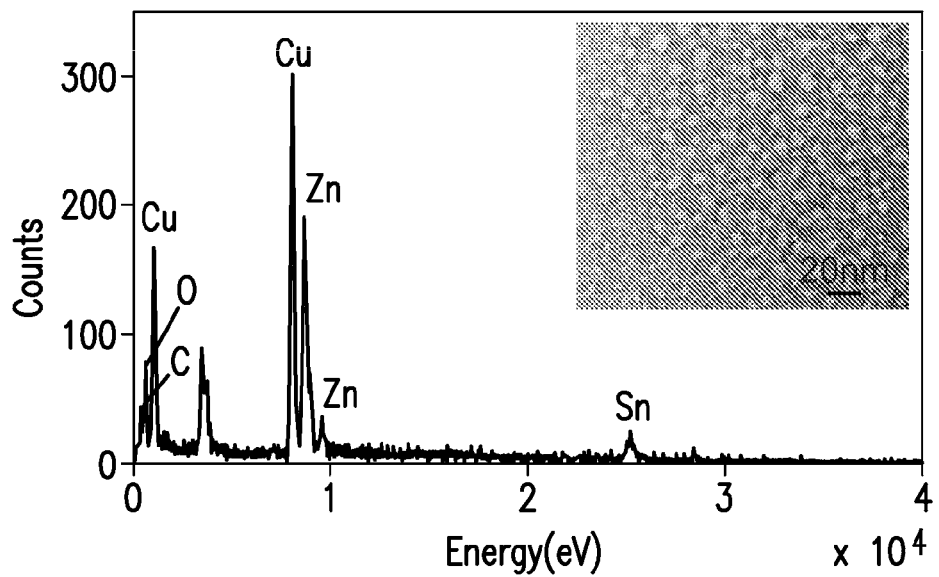
FIG. 11 is a graph showing EDX data indicating 40% Zn and 25% Sn in ZnO:SnO2 mixture. The inset photo is a TEM image of 40 nm deposited film.
Figure 12A:
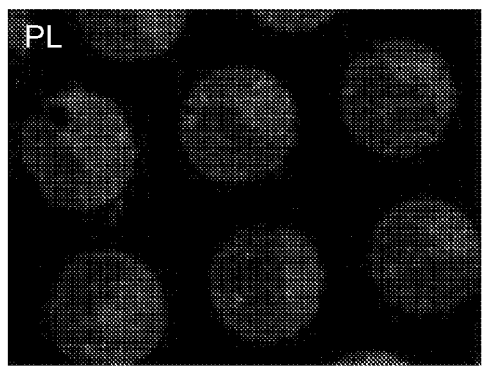
FIG. 12 shows photoluminescence (PL) and electroluminescence (EL) images from patterned silicon substrate.
Figure 12C:
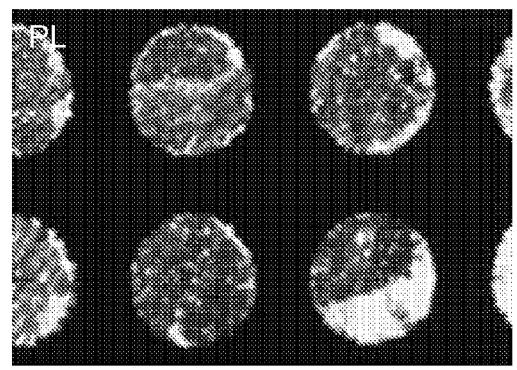
Figure 12B:
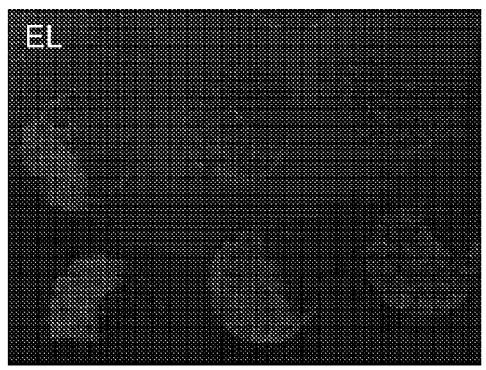
Figure 12D:
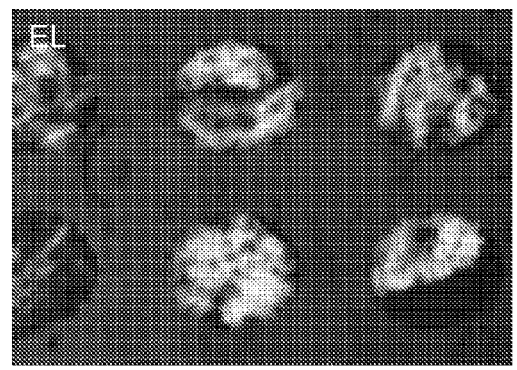

Mixture ratio of the sputtered ZnO and SnO$_2$ was further optimized in the silicon inorganic light emitting diodes. Sn acts as an n-type dopant for ZnO. FIG. 10 indicates the impact of the emission from ZnO:SnO$_2$ on the QD EL spectrum for one set of light emitting devices. For a lower driving voltage, the spectrum is dominated by QD emission. As the voltage increases further, ZnO/SnO$_2$ emission was simultaneously observed along with particle emission. A broad emission was observed from ZnO/SnO$_2$. The inset image shows the orange light emission (598 nm) from particles and yellowish-white emission from ZnO/SnO$_2$. This is due to the imbalance between the electron and hole injection at the nanoparticle layer. This reduces the exciton density at the QD layer thereby reducing the emission intensity from particles. The mixture ratio of ZnO and SnO$_2$ was precisely controlled to obtain proper hole-electron recombination at the QD layer. Emission from ZnO/SnO$_2$ is typically observed at voltages on the order of 30-50 V. Typical mixture ratio was maintained to be 40% Zn and 25% Sn to reduce operating voltage and thus avoid ZnO/SnO$_2$ emission. Concentration of mixture was determined using energy dispersive x-ray (EDX) as shown in FIG. 11, where 40% Zn and 25% Sn was present. From the TEM image of the deposited film, white portions indicate presence of ZnO and dark areas indicate presence of SnO$_2$. The size of the ZnO particles in the mixture of ZnO:SnO$_2$ is comparable to that of the CdSe:ZnS particles used in the system.

Electroluminescence Measurement

With modest turn on voltage, electroluminescence is observed at room temperature. Most of the diodes demonstrated steady light emission for more than an hour of operation, proving the great stability of inorganic multi-layer structure. Electroluminescence from QD-LEDs with different average QD diameters is shown in FIG. 12. Emission from circular-patterned particles of size 7.8 and 9.8 nm was observed. FIGS. 12($a$)-($d$) are for particles of size 9.8 nm (photoluminescence peak: 618 nm) and 7.8 nm (564 nm), respectively. For the electroluminescence in FIG. 12($d$), one can observe slight emission of ZnO/SnO$_2$ mixture along with particle emission. A larger voltage was required to view light emission from smaller particles as 7.8 nm, resulting in simultaneous emission from ZnO/SnO$_2$ on the background.

Figure 13A:
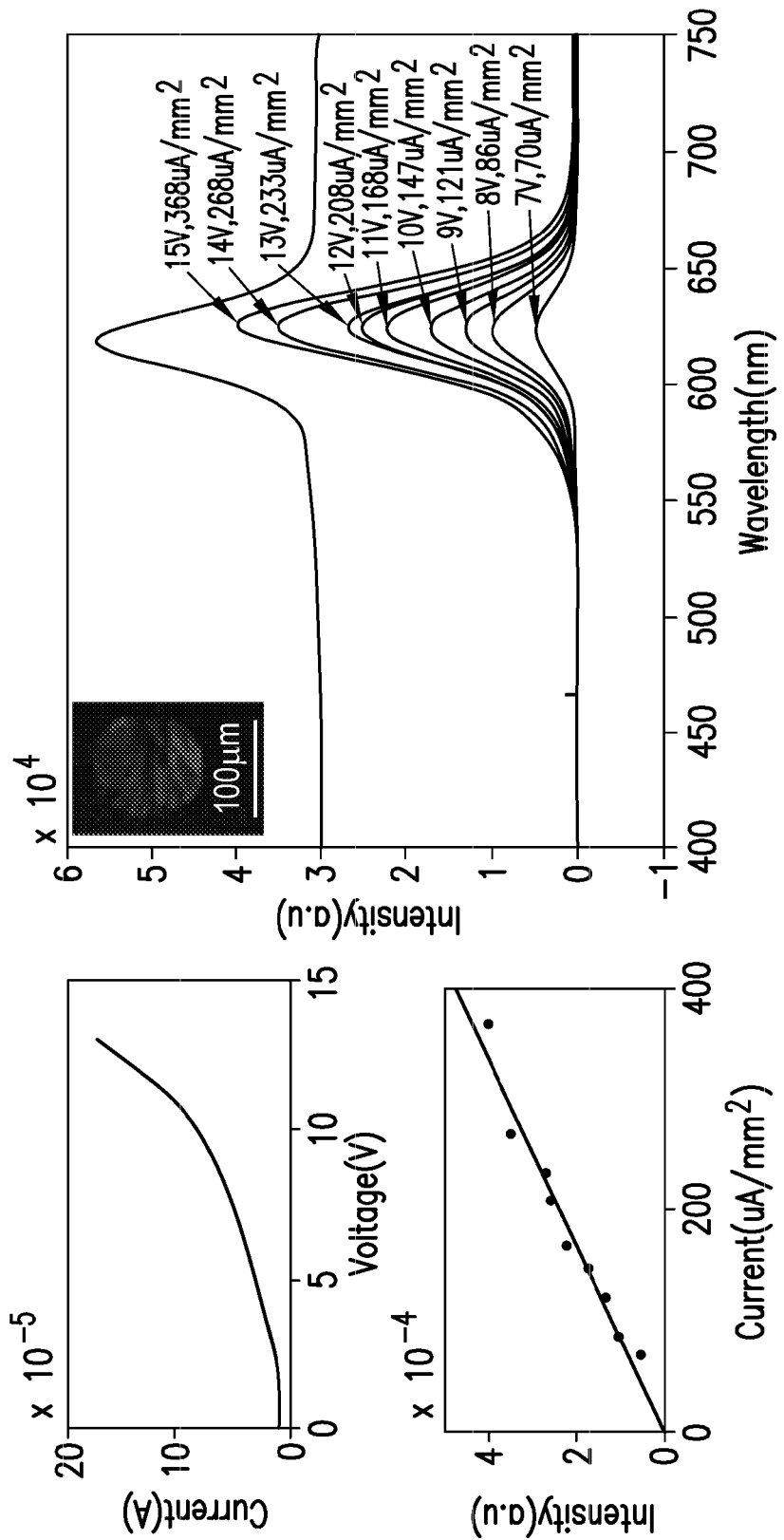
FIG. 13 shows the characteristics of three different color LEDs. Panels (a1), (b1), and (c 1) show current versus voltage. Panels (a2), (b2), and (c2) show luminance versus current characteristics. Panels (a3), (b3), and (c3) show photoluminescence and electroluminescence with different operating conditions. The inset images show electroluminescence for the QD-LED.
Figure 13B:
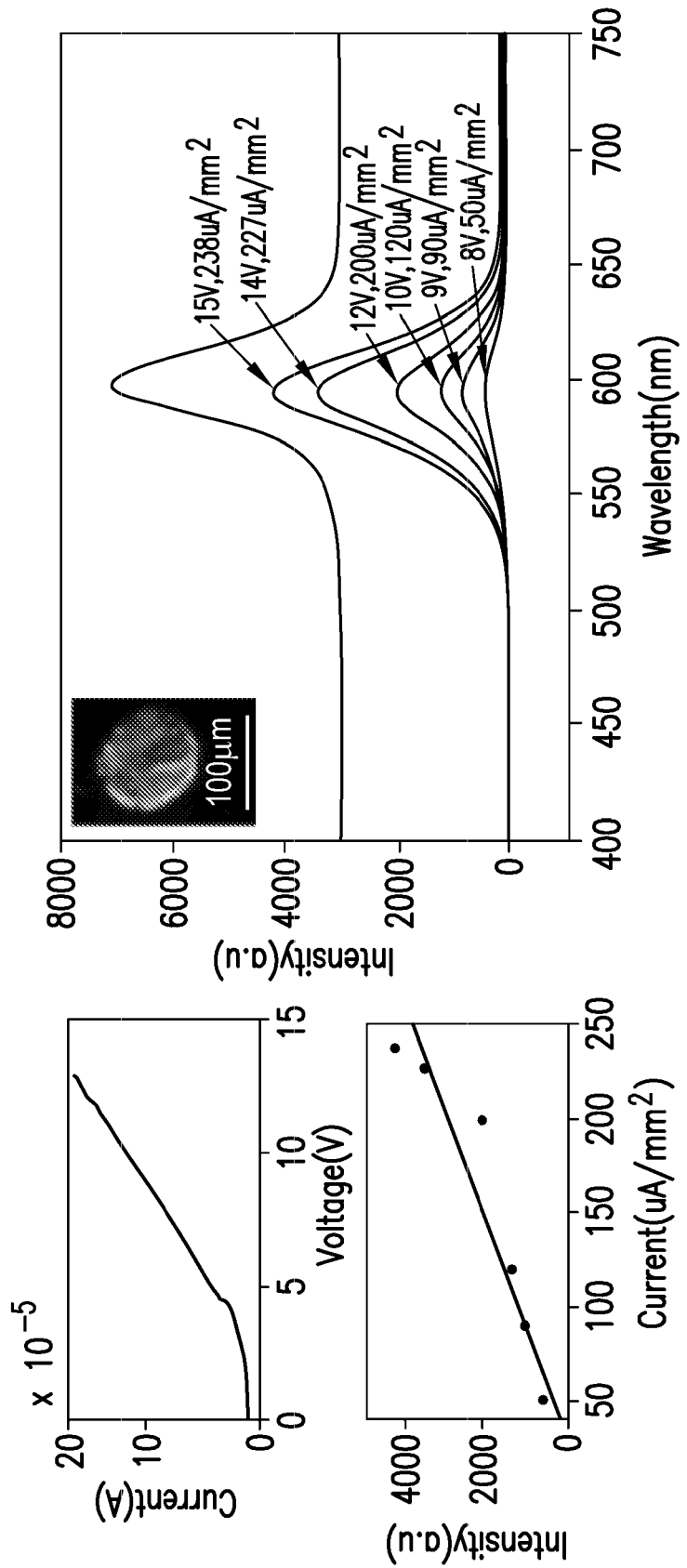
Figure 13C:
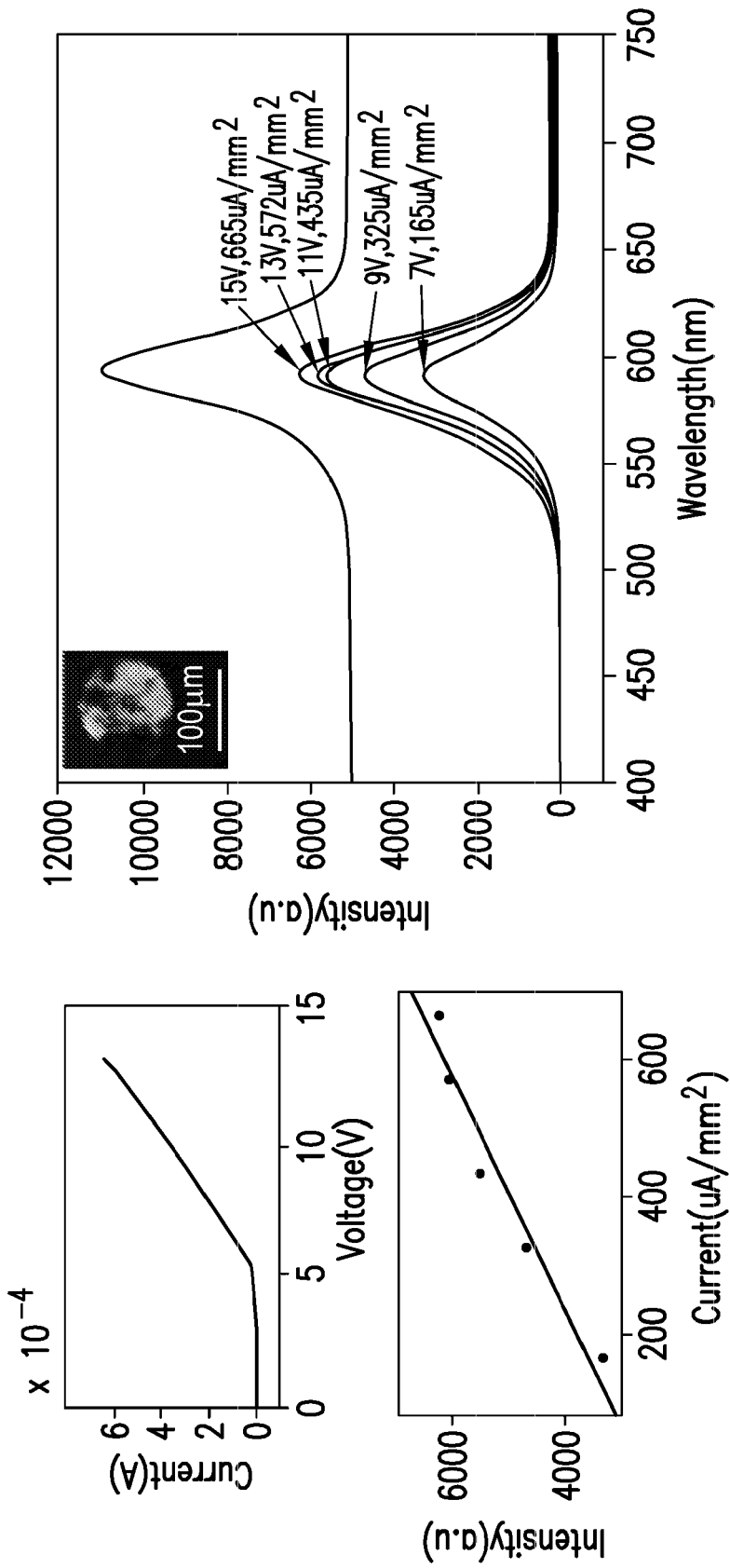

FIG. 13 shows the basic characteristics of the QD-LEDs with three different colors. Electroluminescence spectrum and image of the working device were observed indicating that the emission from the device is dominated by the emission from the quantum dots layer. Current-voltage characteristics are shown in FIGS. 13($a1$)-($c1$). Forward bias is observed when p-type silicon is the positive electrode and Ag/Au electrode is grounded. Turn on voltages for LEDs with average particle size 9.8 nm, 9.0 nm and 8.4 nm were 2 V, 4 V and 5 V respectively. It was observed that for all the devices forward current increases as the forward voltage increases. Smaller the particle, larger is the band gap and so is the required turn on voltage for the device to show light emission. It was observed that the current required to view light emission was on the order of 40-50 µA mm$^{-2}$. Current-intensity plots in FIGS. 13($a2$)-($c2$) indicate a linear relationship between the increase in intensity and current flow through the device.

In literature it has been reported that luminance of 53 cd m$^{-2}$ at a current density 860 µA mm$^{-2}$ and at a voltage 14 V was observed for TOLED with Si anode (Parker and Kim, Appl. Phys. Lett. 64:1774, 1994). The luminance of the device at 10 V with CdSe:ZnS nanoparticles, of particle size 9.8, 9.0 and 8.4 nm was observed to be 482, 375 and 489 cd m$^{-2}$ for emission wavelength 622, 598 and 576 nm was calculated for the particular emission area. The current density of 147 µA mm$^{-2}$, 120 µA mm$^{-2}$ and 375 µA mm$^{-2}$ was measured for 1 mm×1 mm top electrode dimension for diodes with nanoparticles of size 9.8 nm, 9.0 nm and 8.4 nm respectively.

FIGS. 13($a3$)-($c3$) show the electroluminescence and photoluminescence of the LEDs plotted for particle size 9.8 nm, 9.0 nm and 8.4 nm, respectively. A strong electroluminescence band was observed from CdSe particles with full width half maximum (FWHM) of about 40 nm. This was observed to be similar to that of photoluminescence. The electroluminescence emission peak was observed at 622 nm, 598 nm and 576 nm for the red, orange, and yellow emitting devices, respectively. A slight red shift was observed between the photoluminescence (peaked at 618 nm) and electroluminescence (622 nm) spectra in FIG. 13($a3$). This is similar to the CdTe particles that have a red shift due to the trap filling or detrapping on the surface states (Chen et al., J. Nanosci. Nanotechnol. 2:47, 2002). The small red shift of (about 5 nm) and slight broadening of the electroluminescent spectra, when compared to the photoluminescence spectra, can also be attributed to effects such as energy and charge transfer among nanoparticles (Dabbousi et al., Appl. Phys. Lett. 66:1316, 1995; Zhao et al., J. Appl. Phys. 96:3206, 2004). It was also observed that the power consumed by these devices was typically small. For instance, devices with 9.8 nm particles consumed typically 5 mW power for an area of 1 mm×1 mm.

Quantum dot based inorganic light emitting diodes have been fabricated through stamping nanoparticles directly onto silicon hole transporting layer. The creation of quantum dot monolayer can be done at room temperature using microcontact printing via PDMS. The generation of excitons in the quantum dot layer occurs through direct charge injection. Electrons are injected from Ag/Au contact through the ZnO:SnO$_2$. They are eventually transported to the QDs where they are better confined due to their higher electron affinity. Optimal thickness of monolayers of nanoparticles stamped onto to the substrate was determined by atomic force microscopy (AFM). Thickness of the nanoparticle film varied between 30 nm, 40 nm and 50 nm (±5 nm) depending on the size particles 9.8 nm, 9.0 nm and 8.4 nm respectively were found optimal for the silicon-based QD-LED. When voltage was applied to the QD-LED, electroluminescence (peaked at 622, 598 and 576 nm) identical to the photoluminescence (618, 598 and 576 nm) was observed depending on the average diameter of the used QDs (9.8 nm, 9.0 nm and 8.4 nm, respectively). The LED demonstrated steady light emission for hours of operation, proving the great stability of inorganic multilayer structure. The ease of fabrication and processing of colloidal QD on silicon, through microcontact printing and further integration with metal oxides, open up the possibilities for creating nanophotonic microsystems with mass reproducibility and enable robust, compact and tunable imaging, sensing and display applications.

The methods of the appended claims are not limited in scope by the specific methods described herein, which are intended as illustrations of a few aspects of the claims and any methods that are functionally equivalent are within the scope of this disclosure. Various modifications of the methods in addition to those shown and described herein are intended to fall within the scope of the appended claims. Further, while only certain representative methods and aspects of these methods are specifically described, other methods are intended to fall within the scope of the appended claims. Thus a combination of steps, elements, components, or constituents may be explicitly mentioned herein; however, all other combinations of steps, elements, components, and constituents are included, even though not explicitly stated.

What is claimed is:

1. A method of uniformly transferring luminescent quantum dots onto a substrate, comprising:
   a) preparing a colloidal suspension of luminescent quantum dots in a hydrophobic solvent, wherein the density of the hydrophobic solvent is from 0.67 g/cm$^3$ to 0.96 g/cm$^3$;
   b) dispensing the suspension onto a convex aqueous surface;
   c) allowing the hydrophobic solvent to evaporate, thereby forming a film of luminescent quantum dots;
   d) contacting the film of luminescent quantum dots with a hydrophobic stamp; and
   e) depositing the film of luminescent quantum dots onto a substrate with the hydrophobic stamp.

2. The method of claim 1, further comprising precipitating and re-suspending the luminescent quantum dots in a non-polar solvent prior to the step of preparing the suspension.

3. The method of claim 2, wherein the non-polar solvent is hexane.

4. The method of claim 1, wherein the colloidal suspension of luminescent quantum dots is prepared in a mixture of two hydrophobic solvents.

5. The method of claim 4, wherein the mixture of two hydrophobic solvents is a mixture of hexane and 1,2-dichloroethane.

6. The method of claim 5, wherein the mixture of hexane and 1,2-dichloroethane is a 1:1 mixture.

7. The method of claim 1, wherein the hydrophobic stamp is formed from polydimethylsiloxane.

8. The method of claim 1, wherein the substrate is a silicon based substrate.

9. The method of claim 1, wherein the substrate with the film of luminescent quantum dots is used in a light emitting diode.

10. The method of claim 1, wherein the luminescent quantum dots are formed of CdSe:ZnS.

11. The method of claim 1, wherein the thickness of the film deposited onto the substrate is from 25 nm to 55 nm.

12. The method of claim 11, wherein the thickness of the film deposited onto the substrate is from 30 nm to 50 nm.

13. The method of claim 11, wherein the thickness of the film deposited onto the substrate is from 35 nm to 45 nm.

14. A method of preparing quantum dot based light emitting diodes, comprising:
   a) preparing a colloidal suspension of luminescent quantum dots in a hydrophobic solvent, wherein the density of the hydrophobic solvent is from 0.67 g/cm$^3$ to 0.96 g/cm$^3$;
   b) dispensing the suspension onto a convex aqueous surface;
   c) allowing the hydrophobic solvent to evaporate, thereby forming a film of luminescent quantum dots;
   d) contacting the film of luminescent quantum dots with a hydrophobic polydimethylsiloxane stamp; and
   e) depositing one or more layers of the film of luminescent quantum dots onto a silicon substrate.

15. The method of claim 14, further comprising depositing a plurality of layers of the film of luminescent quantum dots onto the silicon substrate.

16. The method of claim 14, wherein the luminescent quantum dots are formed of material selected from CdSe:ZnS.

17. The method of claim 15, wherein the luminescent quantum dots are formed of material selected from CdSe:ZnS.

* * * * *